United States Patent
Willshere et al.

(10) Patent No.: US 7,549,371 B2
(45) Date of Patent: Jun. 23, 2009

(54) METHOD AND APPARATUS FOR CLAMPING A SUBSTRATE

(75) Inventors: Richard Willshere, Weymouth (GB); Joseph A. Perault, Natick, MA (US); James Lynch, Uxbridge, MA (US); Mark E. Rossmeisl, Franklin, MA (US)

(73) Assignee: Speedline Technologies, Inc., Franklin, MA (US)

( * ) Notice: Subject to any disclaimer, the term of this patent is extended or adjusted under 35 U.S.C. 154(b) by 409 days.

(21) Appl. No.: 11/483,493

(22) Filed: Jul. 10, 2006

(65) Prior Publication Data

US 2008/0006162 A1  Jan. 10, 2008

(51) Int. Cl.
  *B05C 17/08* (2006.01)
(52) U.S. Cl. .................................. 101/126; 101/123
(58) Field of Classification Search ............. 101/114, 101/123, 124, 126, 127.1, 129
   See application file for complete search history.

(56) References Cited

U.S. PATENT DOCUMENTS

| | | | |
|---|---|---|---|
| 5,060,063 A | 10/1991 | Freeman | |
| 5,157,438 A | 10/1992 | Beale | |
| RE34,615 E | 5/1994 | Freeman | |
| 5,752,446 A | 5/1998 | Squibb | |
| 5,943,089 A | 8/1999 | Douglas | |
| 6,621,517 B1 | 9/2003 | Squibb | |
| 6,738,505 B1 | 5/2004 | Prince | |
| 6,810,138 B1 | 10/2004 | Schanz | |
| 6,891,967 B2 | 5/2005 | Prince | |
| 7,028,391 B2 | 4/2006 | Pham-Van-Diep et al. | |
| 7,225,732 B2 * | 6/2007 | Sakaue et al. ............ | 101/127.1 |
| 2001/0004795 A1 | 6/2001 | Ishitani et al. | |
| 2004/0142099 A1 | 7/2004 | Rossmeisl et al. | |

(Continued)

FOREIGN PATENT DOCUMENTS

EP  0 392 516 B1  10/1990

(Continued)

OTHER PUBLICATIONS

Ekra-Eva™ Vision-System; http://www.ekra.com/pages/eva.html; 1 page.

(Continued)

*Primary Examiner*—Ren Yan
(74) *Attorney, Agent, or Firm*—Lowrie, Lando & Anastasi, LLP

(57) ABSTRACT

A stencil printer for printing viscous material on a substrate includes a frame, a stencil coupled to the frame, and a print head, coupled for the frame, to deposit and print viscous material over the stencil. The stencil printer further includes a substrate support to support a substrate in a print position and a substrate clamping assembly to clamp the substrate in the print position. In a certain embodiment, the substrate clamping assembly includes a pair of rail members coupled to the frame. The rail members are adapted to engage opposite edges of the substrate. The substrate clamping assembly further includes a pair of foils, one for each rail member, with each foil being releasably secured to the rail member in a position so that the foil overlies the substrate. The substrate clamping assembly also includes a pair of clamping members, one for each rail member and foil, to releasably secure the foil in place on the rail member.

8 Claims, 6 Drawing Sheets

U.S. PATENT DOCUMENTS

2005/0155501 A1    7/2005    Sakaue et al.
2006/0081138 A1    4/2006    Perault et al.

FOREIGN PATENT DOCUMENTS

GB      2 403 003 A    12/2004
WO    2007055409 A1    5/2007

OTHER PUBLICATIONS

Patent Abstracts of Japan; JP 2002234131 A (Sony Corp.); Aug. 20, 2002; 1 pg.
International Search Report for PCT/US2006/043166 mailed Feb. 2, 2007.
International Search Report for PCT/US2007/014861 mailed Apr. 3, 2008.

* cited by examiner

US 7,549,371 B2

METHOD AND APPARATUS FOR CLAMPING A SUBSTRATE

BACKGROUND OF INVENTION

1. Field of Invention

The present invention relates generally to substrate support assemblies for supporting and stabilizing a substrate within a machine that performs an operation on the substrate, and more particularly to a substrate clamping assembly of a stencil printer particularly designed to clamp edges of the substrate during a print operation.

2. Discussion of Related Art

In a typical surface-mount circuit board manufacturing operation, a stencil printer is used to print solder paste onto a printed circuit board. A circuit board, broadly referred to as an electronic substrate, having a pattern of pads or some other conductive surface onto which solder paste will be deposited, is automatically fed into the stencil printer. One or more small holes or marks on the circuit board, called fiducials1, is used to align the circuit board with the stencil or screen of the stencil printer prior to the printing of solder paste onto the circuit board. Once a circuit board has been aligned with the stencil in the printer, the circuit board is raised to the stencil by a substrate support, e.g., a table having pins, and fixed with respect to the stencil. Solder paste is then dispensed onto the stencil, and a wiper blade or squeegee traverses the stencil to force the solder paste through apertures formed in the stencil and onto the board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste is typically dispensed onto the stencil from a standard cartridge. After the print operation, the board is then released, lowered away from the stencil, and transported to another station within the printed circuit board fabrication line.

There are a number of well-know methods for clamping the circuit board so that it is stabilized during the print operation. One such method is disclosed in U.S. Pat. No. 5,157,438 to Beale, which discloses a clamping mechanism having very thin foils that project over opposite edges of the circuit board for securing the circuit board to the support assembly. One disadvantage associated with this approach is that the foils are attached to their respective rails by adhesive. The arrangement is such that when a foil fails, the entire foil and rail must be replaced. It is expensive to replace the entire rail assembly, when only the foil is damaged.

SUMMARY OF INVENTION

Embodiments of the invention provide improvements to stencil support assemblies, such as those described above.

A first aspect of the invention is directed to a stencil printer for printing viscous material on a substrate. In one embodiment, the stencil printer comprises a frame, a stencil coupled to the frame, and a print head, coupled for the frame, to deposit and print viscous material over the stencil. The stencil printer further comprises a substrate support to support a substrate in a print position and a substrate clamping assembly to clamp the substrate in the print position. In a certain embodiment, the substrate clamping assembly comprises a pair of rail members coupled to the frame. The rail members are adapted to engage opposite edges of the substrate. The substrate clamping assembly further comprises a pair of foils, one for each rail member, with each foil being releasably secured to the rail member in a position so that the foil overlies the substrate. The substrate clamping assembly also comprises a pair of clamping members, one for each rail member and foil, to releasably secure the foil in place on the rail member.

Embodiments of the stencil printer may further include a clamping mechanism, coupled to the frame, to move at least one of the rail members against the substrate to clamp the substrate. In one embodiment, the clamping mechanism comprises at least one piston to move the at least one of the rail members between a first position in which the rail member is spaced away from one of the opposite edges of the substrate and a second position in which the rail member engages one of the opposite edges of the substrate to clamp the substrate between the rail members during a print operation. The clamping mechanism may further comprise a pressure regulator to control a clamping force applied by the piston to the rail member against the edge of the substrate. The substrate support may comprise a flexible support member. In another embodiment, the substrate support may comprise a plurality of pins adapted to engage and support the bottom surface of the substrate. Each foil member is configured to prevent a z-directional movement of the substrate. The substrate clamping assembly further comprises at least one fastener to releasably secure the clamping member to the rail member with the foil member disposed between the clamping member and the rail member. Each rail member may be formed with a foil seat configured to receive the foil therein. The foil seat may include a sloped surface, with the foil being bent to engage the sloped surface.

Another aspect of the invention is directed to a method for supporting and clamping a substrate in a print position during a print operation of a stencil printer. In one embodiment, the method comprises supporting the substrate at the print position, clamping opposite edges of the substrate, and preventing a z-directional movement of the substrate with a foil releasably secured to a rail of the stencil printer.

Embodiments of the method may further comprise controlling a clamping force at which the substrate is clamped, and/or raising the substrate to the print position.

A further aspect of the invention is directed to an apparatus for performing an operation on an electronic substrate. The apparatus comprises a frame and a module, coupled to the frame, to perform an operation on the electronic substrate. The stencil printer further comprises a substrate support to support a substrate in a print position; and a substrate clamping assembly to clamp the substrate in the print position. In a certain embodiment, the substrate clamping assembly comprises a pair of rail members coupled to the frame. The rail members are adapted to engage opposite edges of the substrate. The substrate clamping assembly further comprises a pair of foils, one for each rail member, with each foil being releasably secured to the rail member in a position so that the foil overlies the substrate. The substrate clamping assembly also comprises a pair of clamping members, one for each rail member and foil, to releasably secure the foil in place on the rail member.

Embodiments of the stencil printer may further include a clamping mechanism, coupled to the frame, to move at least one of the rail members against the substrate to clamp the substrate. In one embodiment, the clamping mechanism comprises at least one piston to move the at least one of the rail members between a first position in which the rail member is spaced away from one of the opposite edges of the substrate and a second position in which the rail member engages one of the opposite edges of the substrate to clamp the substrate between the rail members during a print operation. The clamping mechanism may further comprise a pressure regulator to control a clamping force applied by the piston to the rail member against the edge of the substrate. The substrate support may comprise a flexible support member. In another embodiment, the substrate support may comprise a plurality of pins adapted to engage and support the bottom surface of the substrate. Each foil member is configured to prevent a z-directional movement of the substrate. The substrate clamping assembly further comprises at least one fastener to releasably secure the clamping member to the rail member with the foil member disposed between the clamping member and the rail member. Each rail member may be formed with a foil seat configured to receive the foil therein. The foil seat may include a sloped surface, with the foil being bent to engage the sloped surface.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
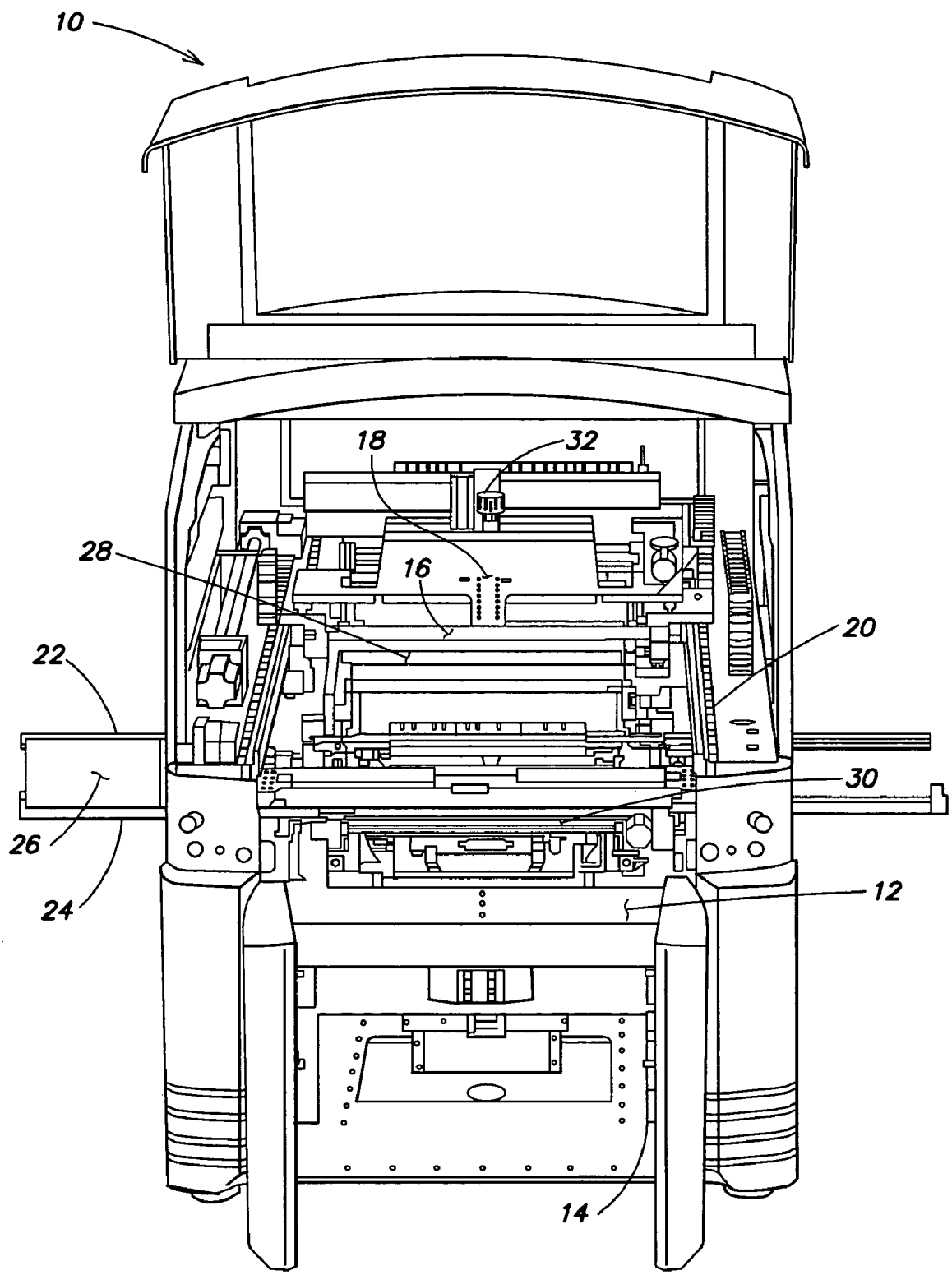
FIG. 1 shows a front perspective view of a stencil printer of an embodiment of the present invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

For purposes of illustration, embodiments of the present invention will now be described with reference to a stencil printer used to print solder paste onto a printed circuit board. One skilled in the art will appreciate, however, that embodiments of the present invention are not limited to stencil printers that print solder paste onto circuit boards, but rather, may be used in other applications requiring dispensing of other viscous materials, such as glues and encapsulents. For example, embodiments of the present invention can also be used in dispensers, reflow ovens, wave solder machines, and pick and place machines, or any other apparatus used to secure a component to an electronic substrate (e.g., a printed circuit board) during a work operation. Further, stencil printers in accordance with embodiments of the present invention are not limited to those that print solder paste on circuit boards, but rather, include those used for printing other materials on a variety of substrates. Also, the terms screen and stencil may be used interchangeably herein to describe a device in a printer that defines a pattern to be printed onto a substrate.

Referring now to the drawings, and more particularly to FIG. 1, there is generally indicated at 10 a stencil printer of an embodiment of the invention. As shown, the stencil printer 10 includes a frame 12 that supports components of the stencil printer. The components, in part, may include a controller 14, a stencil 16, and a print head 18 having a dispenser from which solder paste may be dispensed. Each of these components may be suitably coupled to the frame 12. In one embodiment, the print head 18 is on a gantry 20, which enables the print head to be moved in the x-, y- and z-directions under the control of the controller 14. As described below in further detail, the print head 18 may be placed over the stencil 16 and moved across the stencil to allow printing of solder paste onto a circuit board.

Stencil printer 10 may also include a conveyor system having rails 22, 24 for transporting a circuit board 26 to a print position in the stencil printer. The stencil printer 10 has an assembly, generally indicated at 28, for supporting and clamping the printed circuit board 26 (or "substrate"), which, as will be described in greater detail below, raises and clamps the printed circuit board so that it is stable during a print operation. The substrate supporting and clamping assembly 28 may further include a substrate support system 30, e.g., a plurality of pins or flexible tooling, positioned beneath the circuit board 26 when the circuit board is in the print position. The substrate support system 30 may be used, in part, to support the interior regions of the circuit board 26 to prevent flexing or warping of the circuit board during the print operation.

The print head 18 may be configured to receive at least one solder paste cartridge 32 that provides solder paste to the print head during the print operation. Although not illustrated in FIG. 1, the solder paste cartridge 32 may be coupled to one end of a pneumatic air hose, while the other end of the pneumatic air hose may be attached to a compressor that, under the control of the controller 14, provides pressurized air to the cartridge to force solder paste out of the cartridge into the print head 18 and onto the stencil 16. Mechanical devices, such as a piston, may be used in addition to, or in place of, air pressure to force the solder paste from the cartridge 32 into the print head 18. The controller 14 may be configured to use a personal computer having a Microsoft DOS or Windows XP operating system with application specific software to control the operation of the stencil printer 10.

In one configuration, the stencil printer 10 operates as follows. A circuit board 26 is loaded into the stencil printer 10 using the conveyor rails 22, 24. The supporting and clamping assembly 28 raises and clamps the circuit board 26 to a print position. The print head 18 is then lowered in the z-direction until blades of the print head contact the stencil 16. The print head 18 is then moved in the y-direction across the stencil 16. The print head 18 deposits solder paste out of the dispenser of the print head through apertures in the stencil 16 and onto the circuit board 26. Once the print head 18 has fully traversed the stencil 16, the circuit board 26 is released, lowered back onto the conveyor rails 22, 24 and transported from the printer 10 so that a second circuit board may be loaded into the printer. To print on the second circuit board, the print head 18 is moved across the stencil 16 in the direction opposite to that used for the first circuit board. Alternatively, in another embodiment, a squeegee arm (not shown) could swing inwardly to contain the solder paste in the print head 18, and the print head can then be lifted in the z-direction and moved back to its original position to perform a print operation on the second circuit board using a similar direction stroke.

Figure 2:
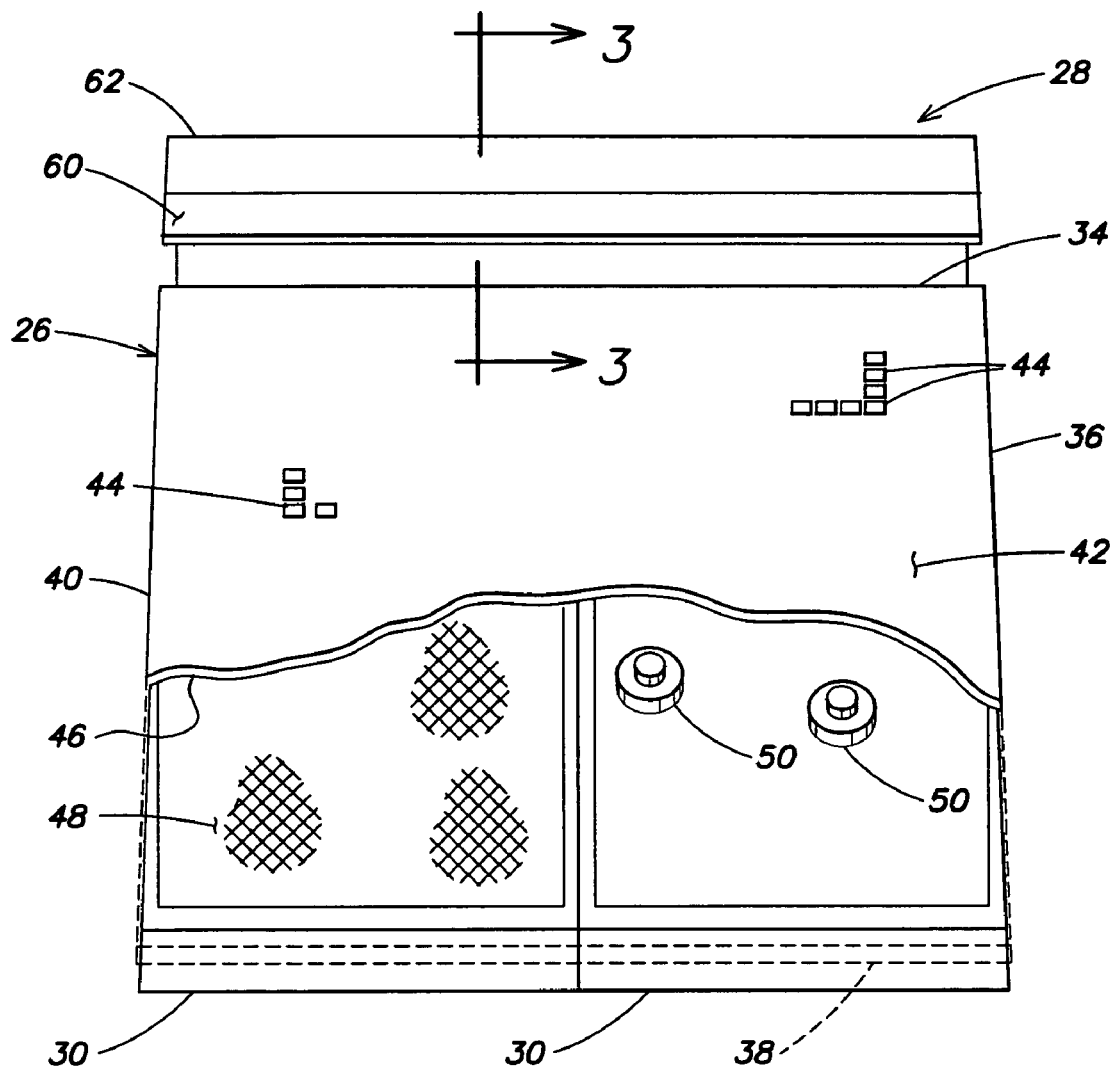
FIG. 2 shows a top perspective, schematic view of a portion of a clamping assembly of an embodiment of the invention with a substrate, e.g., a printed circuit board, illustrated in a lowered, pre-print position.

Referring to FIG. 2, the construction of the supporting and clamping assembly 28 in accordance with one embodiment is illustrated in greater detail. As shown, the printed circuit board 26 has a thin, rectangular body having four edges 34, 36, 38 and 40, two of which (34, 38) may be clamped during a print operation. The circuit board 26 includes a top surface 42 having a plurality of pads 44 which are adapted to have solder paste deposited thereon during the print operation. The underneath or bottom surface 46 of the printed circuit board 26 is supported, in part, by the substrate support system 30, which prevents the printed circuit board from flexing or warping during the print operation. For illustration purposes only, two support systems 30 are shown in FIG. 2. On the left-hand side of FIG. 2, in a certain embodiment, a flexible support system, e.g., gel tooling 48, supports the printed circuit board 26. Such a support system is disclosed in U.S. patent application Ser. No. 10/394,814, entitled METHOD AND APPARATUS FOR SUPPORTING A SUBSTRATE, which is owned by the assignee of the present invention and incorporated herein by reference. The flexible support system 48 may be adapted to conform to the bottom surface 46 of the printed circuit board 26 to support the circuit board in a uniform manner.

On the right hand side of FIG. 2, in another embodiment, the support system 30 comprises a plurality of pins 50 for supporting the printed circuit board 26, which are well-known in the art of stencil printers, and, to a lesser extent, in the art of dispensers. In other embodiments, one support system may be used to support the underneath of the entire circuit board.

Figure 3:
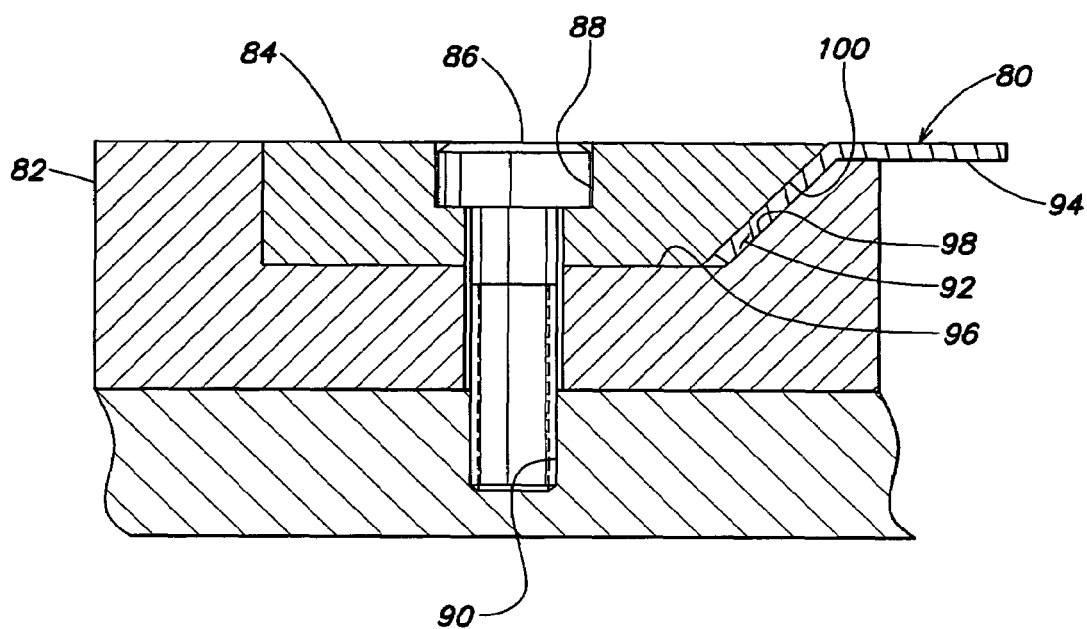
FIG. 3 shows an enlarged cross-sectional view of a clamping assembly taken along line 3-3 in FIG. 2.

Turning now to FIG. 3, in one embodiment, circuit boards are transported into and out of the supporting and clamping assembly 28 by a belt transfer assembly, which is configured to support the underside of the board in the area of the edges 34, 38 of a circuit board 26 (FIG. 2). The belt transfer assembly is part of the conveyor system described above, and cooperates with the rails 22, 24 to transfer circuit boards 26 into and out of the stencil printer 10. Specifically, the belt transfer assembly includes a belt driven by at least one roller (not shown).

In a certain embodiment, a lift mechanism may be provided to raise each board support member and the circuit board from a pre-print position to a raised, print position. Specifically, a table, mechanically coupled to the frame, may be raised to engage a bottom edge of each board support member to lift the printed circuit board off of the belt. Although not shown in FIG. 3, the lift mechanism raises the printed circuit board in a position so that it engages or is proximate to a foil. The weight of the supporting and clamping assembly biases the support members in the pre-print or lowered position. The controller may be configured to control the movement of the circuit board between the pre-print position in which circuit boards are shuttled into and out of the stencil printer by the belt transfer assembly and the raised and print positions in which the print operation is performed on the circuit board.

Figure 4:
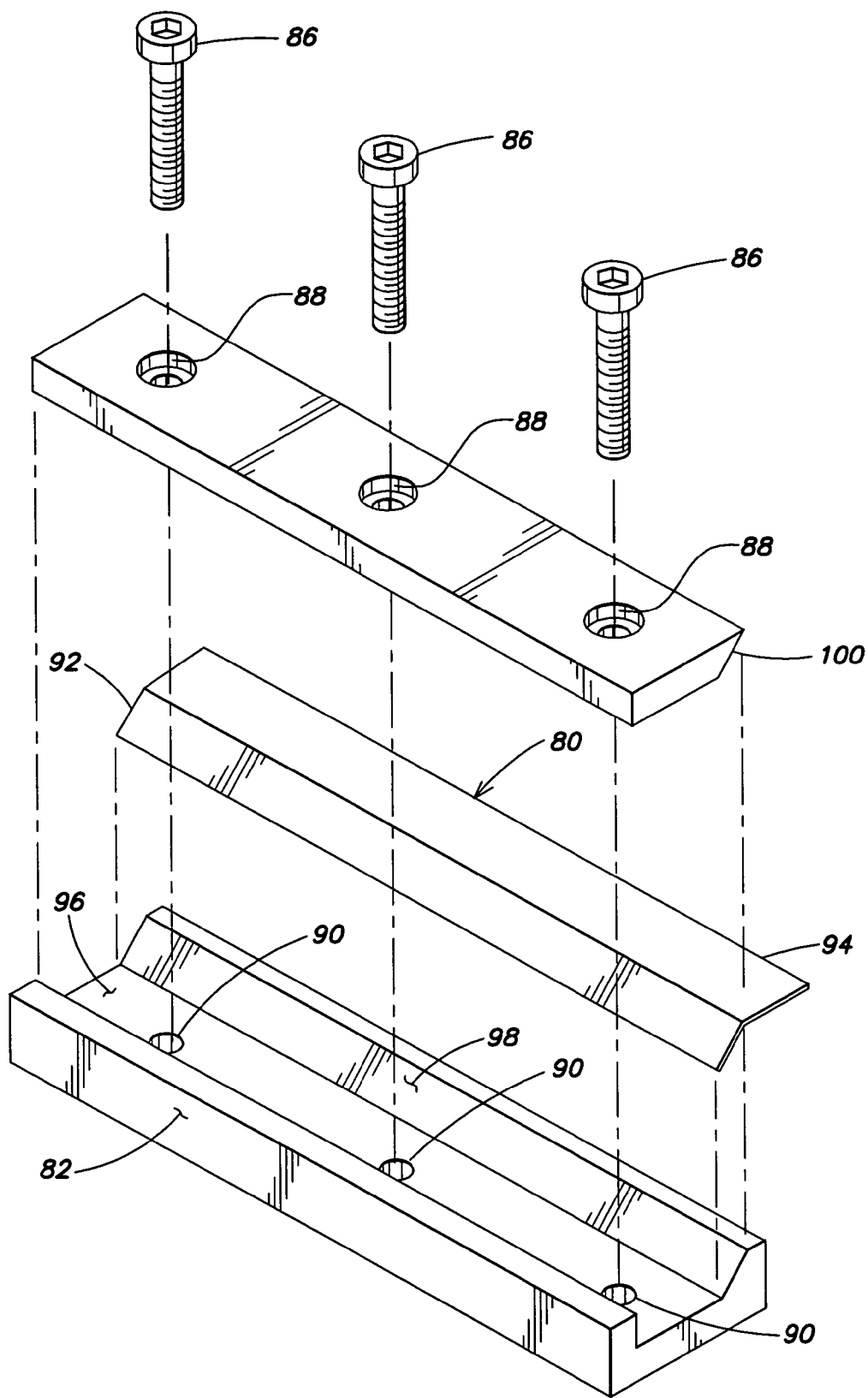
FIG. 4 shows an exploded assembly of a replaceable foil and a clamping member of the clamping assembly shown in FIG. 3.

Referring to FIGS. 3 and 4, in a certain embodiment, the clamping assembly may be configured so that a foil, indicated at 80, is replaceable foil, which is releasably secured to a rail member 82. Specifically, in one embodiment, the foil 80 may be fabricated from spring steel, which is durable construction. Other suitable materials may also be used. In one embodiment, the foil 80 may be fabricated from cold rolled stainless steel, which is between 0.10 and 0.20 mm thick, and preferably about 0.15 mm thick. Other thicknesses may be chosen depending on the operating conditions and clamping forces applied to the substrate. A clamping member 84 may be disposed over the foil 80 so as to secure the foil between the rail member 82 and the clamping member 84. A plurality of fasteners, such as screw fasteners 86, may be provided to secure the clamping member 84 and foil 80 in place on the rail member 82. As shown, there are openings 88 formed in the clamping member 84 that correspond to openings 90 formed in the rail member 82 to releasably secure the foil 80 in place.

In one embodiment, the foil 80 is bent so that an angle is formed along the length of the foil. Specifically, a first leg 92 of the foil 80 is clamped between the clamping member 84 and the rail member 82 so that a second leg 94 that extends over the substrate during use. In a certain embodiment, the angle between the first leg 92 and the second leg 94 may be approximately 135°. The foil 80 is disposed within a foil seat 96 formed in an upper surface of the rail member 82. As shown, the rail member 82 may be part of a rail assembly designed to fit within a slot formed in the rail member 62. The foil seat 96 includes a sloped surface 98 that is configured to receive the first leg 92 of the foil member 80. The clamping member 84 has a mating sloped surface 100 that clamps the foil 80 when securing the clamping member with the fasteners 86.

As shown, FIG. 4 illustrates an exploded assembly of the clamping member 84, foil 80, rail member 82 and screw fasteners 86. In the shown embodiment, the clamping member 84 has three openings 88 that are aligned with three tapped openings 90 formed in the rail member 82 to secure the clamping member to the rail member with the fasteners 86. The number of screw fasteners 86 may be increased or decreased depending on the length of the foil 80. The arrangement is such that when the foil 80 becomes damaged or otherwise requires replacement, the foil is easily removed and replaced by removing the screw fasteners 86 and the clamping member 84. Once the clamping member 84 is removed, the used foil may be removed from the foil seat 96 and replaced with a new foil. Next, the clamping member 84 may be applied over the foil 80 and secured to the rail member 82 with the screw fasteners 86 to securely affix the foil in place.

Figure 5:
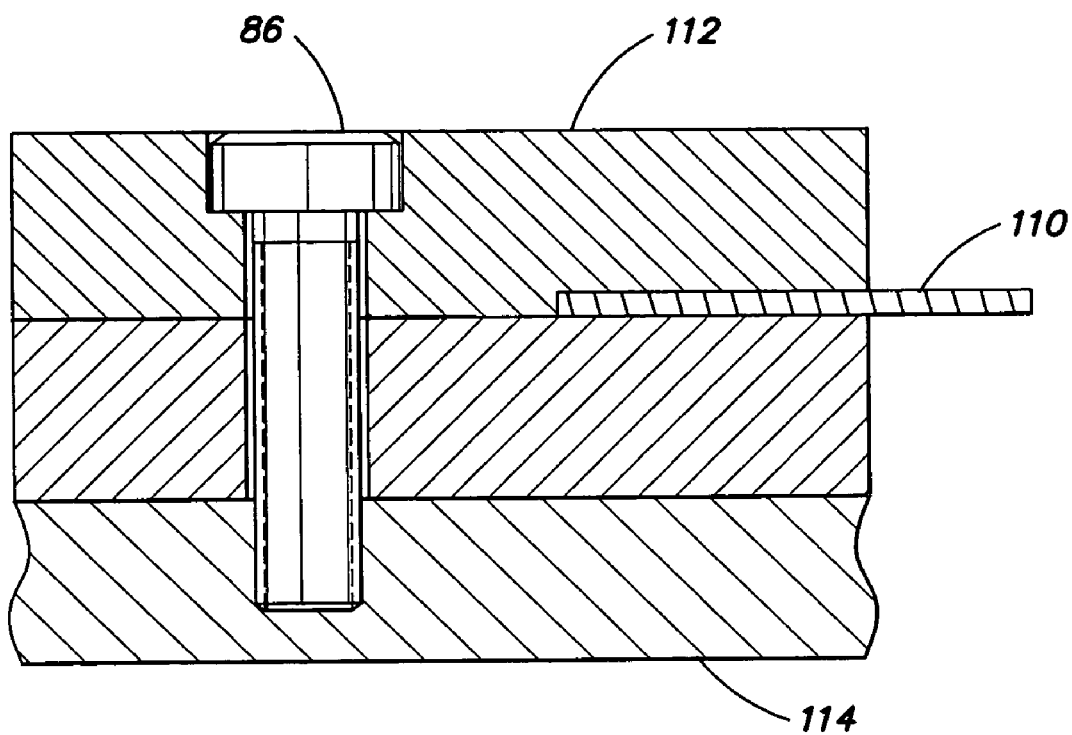
FIG. 5 shows an enlarged cross-sectional view of a clamping assembly of yet another embodiment of the invention.

FIG. 5 illustrates another embodiment of the clamping assembly. Specifically, as shown, a foil 110 is flat in construction. With this configuration, a clamping member 112 may be configured to have a machined out recess that is designed to engage and secure the foil 110 in place when attaching the clamping member to a rail member 114. Screw fasteners 86 may be provided to releasably secure the clamping member 112 and foil 110 in place. The replacement of foil 110 may be achieved in the same manner as the replacement of foil 80.

Figure 6:
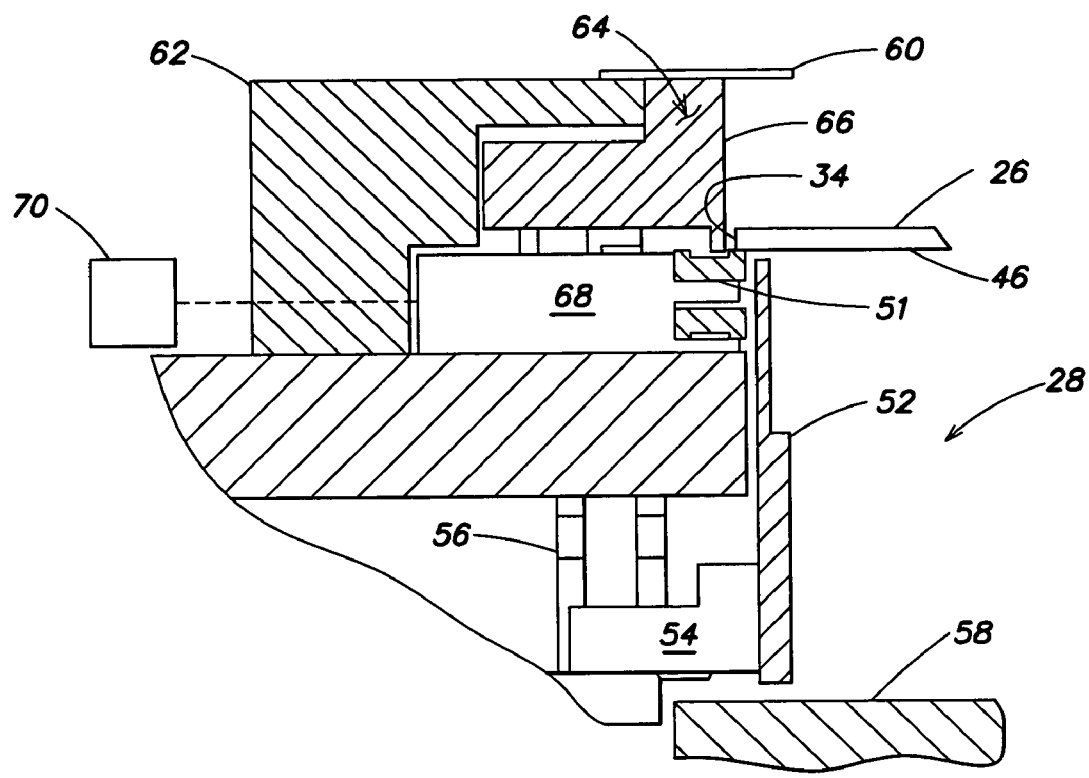
FIG. 6 shows an enlarged cross-sectional view of a clamping assembly similar to the clamping assembly shown in FIG. 5 of yet another embodiment of the invention.

With reference to FIG. 6, the substrate supporting and clamping assembly 28 may be configured to include a pair of board support members (one board support member 52 being shown in FIG. 3), which engage and support the bottom surface 46 of the printed circuit board 26 along the edges 34, 38 of the printed circuit board. The board support members (including board support member 52) are elongate and extend along the length of the edge (34 and 38) of the printed circuit board 26 to provide support along the entire (or nearly entire) edge of the circuit board. As shown, a mounting block 54 is attached to the board support member 52 and slidably coupled to the frame 12 (FIG. 1) of the stencil printer 10 by at least one track 56 formed in the frame.

As with the embodiments shown in FIGS. 3-5, a lift mechanism may be provided to raise each board support mechanism, indicated at 52 in FIG. 6, and the circuit board 26 from a pre-print position to a raise, print position along track 56. Specifically, a table 58, which is mechanically coupled to the frame 12 (FIG. 1), may be raised to engage a bottom edge of each board support member 52 to lift the printed circuit board 26 off of a belt 51. The lift mechanism raises the printed circuit board 26 in a position so that it engages foil 60. The weight of the supporting and clamping assembly 28 biases the support members 52 in the pre-print or lowered position. The controller 14 may be configured to control the movement of the circuit board 26 between the pre-print position in which the circuit boards are shuttled into and out of the stencil printer 10 by the belt transfer assembly and the raised and print positions in which the print operation is performed on the circuit board.

Once the circuit board 26 is loaded into the stencil printer 10, positioned within the supporting and clamping assembly 28 and raised to its alignment position, in one embodiment, the circuit board may be clamped to prevent any lateral movement of the circuit board along the plane of the circuit board during the print operation. Specifically, the supporting and clamping assembly 28 includes a foil member 60 to prevent a z-directional movement of the circuit board 26. In one embodiment, the foil 60 is attached to a fixed rail member 62, the foil being positioned to overlap the edge 34 of the circuit board 26. The attachment of the foil 60 to the rail member will be discussed in greater detail below.

The supporting and clamping assembly 28 may further include a pair of rail members (only one rail member 64 being shown in FIG. 3), which are positioned to engage the opposite edges 34, 38 of the circuit board 26. The rail member 64 illustrated in FIG. 3 may be movable in the manner described below whereas the rail member that is not illustrated in the drawing figures may be fixed. In another embodiment, both rail members are movable to clamp the circuit board in a secure position for enabling a print operation. As shown, an inwardly facing surface 66 of the rail member 64 is positioned proximate to the edge 34 of the circuit board 26 when the circuit board is loaded into the stencil printer 10. The other (fixed) rail member has a similar inwardly facing surface that faces the surface 66 of the movable rail member 64.

As shown in FIG. 3, in a certain embodiment, a clamping mechanism 68 may be configured to move the movable rail member 64 against the edge 34 of the circuit board 26 to secure the circuit board between the rail members. As shown, the clamping mechanism 68 may embody at least one piston, and preferably two or more pistons provided along the length of the movable rail member 64, to move the rail member between a first position in which the rail member is spaced away from the edge 34 of the circuit board 26 and a second position in which the rail member engages the edge of the substrate to clamp the substrate between the rail members during the print operation. It should be understood that a person having ordinary skill in the art, given the benefit of this disclosure, may employ a different mechanism to move the rail member 64 against the edge 34 of the printed circuit board 26 and still fall within the scope of the instant invention. For example, a cam mechanism can be employed to achieve the movement of the rail member 64 between its first and second positions.

A pressure regulator 70 may be further provided to monitor and regulate the pressure applied by the clamping mechanism 68 to the rail member. The pressure regulator 70 communicates with the controller 14 as well as the clamping mechanism 68 so that an operator of the stencil printer 10 can control the clamping force on a circuit board 26. In one embodiment, the clamping force applied by the rail member 64 to the circuit board 26 may be between 1 and 35 pounds, and preferably between 8 and 15 pounds, and more preferably, the clamping force may be approximately 12 pounds. The pressure applied by the clamping mechanism 68 should be sufficient to secure the circuit board 26 firmly between the rail members but not too much so that the circuit board warps due to excessive pressure. It should be noted that the clamping force may be higher than the preferred range for larger circuit boards, and lower than the preferred range for smaller circuit boards. Also, the amount of force applied by the clamping mechanism 68 is related to the thickness of the circuit board being held. Specifically, the thicker the circuit board, the greater the clamping force. Conversely, the thinner the circuit board, the lesser the clamping force.

It should be understood that a person having ordinary skill in the art, given the benefit of this disclosure, may employ a mechanism other than the pressure regulator 70 to monitor and regulate the force applied by the clamping mechanism 68 to the rail member, such as a sensor. In addition, as stated above, even though only one rail member is configured to clamp the circuit board, both rail members can be manipulated to perform the clamping operation. Also, it should be noted that the rail members can be fabricated from any suitable material to secure the circuit board, e.g., steel.

It should be noted that the provision of a clamping mechanism may not be provided. Specifically, the rail members 64 may be fixed in place.

It should be further understood that the supporting and clamping assembly 28 disclosed herein can be implemented in printed circuit board fabrication equipment other than stencil printers. For example, as noted above, the principles disclosed herein can easily be applied to dispensers used to dispense viscous material in printed circuit board fabrication, to wave solder machines, reflow ovens, and in pick and place machines.

In another embodiment, the concept of a replaceable foil may be used in a clamping mechanism having a "flipper-type" mechanism in which the foils are retracted so that the circuit board is clamped by the rails and held in place.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A stencil printer for printing viscous material on a substrate, the stencil printer comprising:
    a frame;
    a stencil coupled to the frame;
    a print head, coupled for the frame, to deposit and print viscous material over the stencil;
    a substrate support to support a substrate in a print position; and
    a substrate clamping assembly to clamp the substrate in the print position, the substrate clamping assembly comprising
        a pair of rail members, coupled to the frame, adapted to engage opposite edges of the substrate, each rail member being formed with a foil seat having a sloped surface,
        a pair of foils, one for each rail member, each foil having a first leg configured without any openings to engage the sloped surface of the foil seat and a second leg bent with respect to the first leg to overly the substrate, and a pair of clamping members, one for each rail member and foil, each clamping member having a mating sloped surface to releasably secure the foil in place on the rail member.

2. The stencil printer of claim 1, wherein the substrate clamping assembly further comprises a clamping mechanism, coupled to the frame, to move at least one of the rail members against the substrate to clamp the substrate.

3. The stencil printer of claim 2, wherein the clamping mechanism comprises at least one piston to move the at least one of the rail members between a first position in which the rail member is spaced away from one of the opposite edges of the substrate and a second position in which the rail member engages one of the opposite edges of the substrate to clamp the substrate between the rail members during a print operation.

4. The stencil printer of claim 3, wherein the clamping mechanism further comprises a pressure regulator to control a clamping force applied by the piston to the rail member against the edge of the substrate.

5. The stencil printer of claim 1, wherein the substrate support comprises a flexible support member.

6. The stencil printer of claim 1, wherein the substrate support comprises a plurality of pins adapted to engage and support the bottom surface of the substrate.

7. The stencil printer of claim 1, wherein each foil member prevents a z-directional movement of the substrate.

8. The stencil printer of claim 1, wherein the substrate clamping assembly further comprises at least one fastener to releasably secure the clamping member to the rail member with the foil member disposed between the clamping member and the rail member.

* * * * *